United States Patent
Matsuzaki et al.

(10) Patent No.: US 9,666,725 B2
(45) Date of Patent: May 30, 2017

(54) SEMICONDUCTOR DEVICE, ELECTRONIC COMPONENT, AND ELECTRONIC DEVICE

(71) Applicant: Semiconductor Energy Laboratory Co., Ltd., Atsugi-shi, Kanagawa-ken (JP)

(72) Inventors: Takanori Matsuzaki, Kanagawa (JP); Tatsuya Onuki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/393,356

(22) Filed: Dec. 29, 2016

(65) Prior Publication Data

US 2017/0110458 A1    Apr. 20, 2017

Related U.S. Application Data

(62) Division of application No. 14/667,794, filed on Mar. 25, 2015, now Pat. No. 9,553,204.

(30) Foreign Application Priority Data

Mar. 31, 2014  (JP) ................................. 2014-072058

(51) Int. Cl.
   *G11C 11/404*   (2006.01)
   *H01L 29/786*   (2006.01)
   *H01L 27/12*    (2006.01)

(52) U.S. Cl.
   CPC ...... *H01L 29/7869* (2013.01); *H01L 27/1225* (2013.01)

(58) Field of Classification Search
   CPC .... G11C 11/404; G11C 11/405; H01L 27/108
   (Continued)

(56) References Cited

U.S. PATENT DOCUMENTS 5,165,075 A  11/1992 Hiroki et al.
5,731,856 A  3/1998 Kim et al.
(Continued)

FOREIGN PATENT DOCUMENTS

EP   1737044 A   12/2006
EP   2226847 A   9/2010
(Continued)

OTHER PUBLICATIONS

Asakuma.N et al., "Crystallization and Reduction of Sol-Gel-Derived Zinc Oxide Films by Films by Irradiation with Ultraviolet Lamp", Journal of Sol-Gel Science and Technology, 2003, vol. 26, pp. 181-184.

(Continued)

*Primary Examiner* — Jason Lappas
(74) *Attorney, Agent, or Firm* — Fish & Richardson P.C.

(57) ABSTRACT

A semiconductor device excellent in writing operation is provided. In a structure where a data voltage supplied to a source line is supplied to a node of a memory cell via a bit line, a switch is provided between memory cells connected to the bit line. During a period in which the data voltage is supplied to the node of the memory cell, the switch on the bit line, which is provided between the memory cells, is off. With such a structure, parasitic capacitance of the bit line during a period in which the data voltage is supplied to the node of the memory cell can be reduced. As a result, writing of the data voltage into the memory cell can be performed fast.

13 Claims, 16 Drawing Sheets

(58) Field of Classification Search
USPC .................................. 365/149, 102, 49.12
See application file for complete search history.

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,363,452 | B2 | 1/2013 | Yamazaki et al. |
| 8,576,620 | B2 | 11/2013 | Yamazaki et al. |
| 8,588,000 | B2 | 11/2013 | Kamata |
| 8,614,916 | B2 | 12/2013 | Nagatsuka et al. |
| 8,638,128 | B1 | 1/2014 | Oo |
| 8,659,935 | B2 | 2/2014 | Yamazaki et al. |
| 8,963,517 | B2 | 2/2015 | Yamazaki et al. |
| 9,001,566 | B2 | 4/2015 | Yamazaki et al. |
| 9,240,244 | B2 | 1/2016 | Nagatsuka et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2012/0262979 | A1* | 10/2012 | Matsubayashi ........ G11C 15/04 365/72 |
| 2012/0287700 | A1 | 11/2012 | Takemura |
| 2014/0071768 | A1 | 3/2014 | Kamata |
| 2014/0092681 | A1 | 4/2014 | Yamazaki et al. |
| 2014/0269099 | A1 | 9/2014 | Nagatsuka et al. |
| 2014/0286073 | A1 | 9/2014 | Onuki |
| 2015/0236163 | A1 | 8/2015 | Yamazaki et al. |
| 2015/0279841 | A1 | 10/2015 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-256400 A | 12/2012 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Trans-

(56) References Cited

OTHER PUBLICATIONS actions on Electron Devices, Jul. 1, 1995, vol. 42, No. 7, pp. 1240-1246.
Cho.D et al., "21.2:Al and Sn-Doped Zinc Indium Oxide Thin Film Transistors for Amoled Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility Zno Thin-Film Transistors Produced at Room Temperature", Appl. Phys. Lett. (Applied Physics Letters), Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Hayashi.R et al., "42.1: Invited Paper: Improved Amorphous In-—Ga—Zn—O TFTS", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters), 2005, vol. 87, pp. 122102-1-122102-3.
Jeong.J et al., "3.1: Distinguished Paper: 12.1-Inch Wxga Amoled Display Driven by Indium-Gallium-Zinc Oxided TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5) Flexible Full Color Top Emission Amoled Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperature over 1000° C.", Journal of Solid State Chemistry, 1985, vol. 60, pp. 382-384.
Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of Am-Oled ", IDW '06 : Proceedings of the 13th International Display Workshops, Dec. 7, 2006, pp. 663-666.
Lee.J et al., "World'S Largest (15-Inch) XGA AMLCD Panel Using IgZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings Of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

(56) References Cited

OTHER PUBLICATIONS

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem Oleds", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA Amoled Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA Amoled Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Eng. Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size Amoled", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent Am-Oled Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission Am-Oled Display", SID Digest '08 : SID International Symposium Digest of Eng Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. Amoled Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA Amoled Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings Of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

200

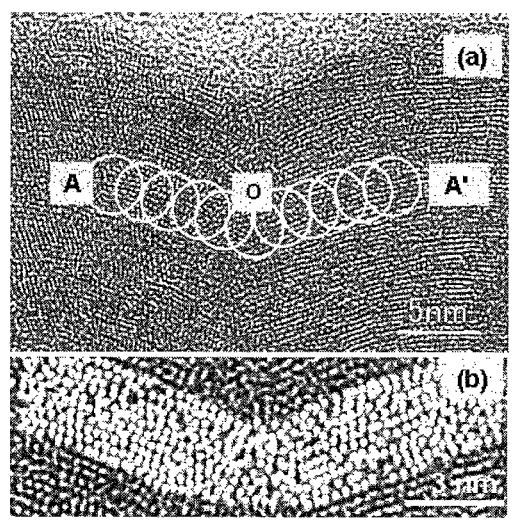
FIG. 9A
FIG. 9B
FIG. 9C
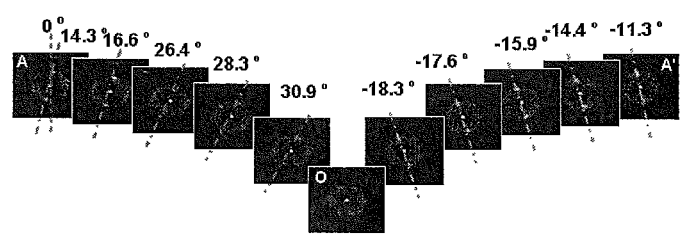

CAAC-OS nc-OS

□ proportion of non-CAAC    ⊟ proportion of CAAC as-sputtered

After heat treatment at 450 °C

SEMICONDUCTOR DEVICE, ELECTRONIC COMPONENT, AND ELECTRONIC DEVICE

CROSS-REFERENCE TO RELATED APPLICATIONS

This application is a divisional of U.S. application Ser. No. 14/667,794, filed Mar. 25, 2015, now allowed, which claims the benefit of a foreign priority application filed in Japan as Serial No. 2014-072058 on Mar. 31, 2014, both of which are incorporated by reference.

BACKGROUND OF THE INVENTION

1. Field of the Invention

One embodiment of the present invention relates to a semiconductor device, an electronic component, or an electronic appliance.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

Patent Document 1 discloses a semiconductor device including a transistor using an oxide semiconductor in its channel formation region (hereinafter, OS transistor) and a transistor using silicon in its channel formation region (hereinafter, Si transistor). Patent Document 1 also discloses that off-state current of an OS transistor is low.

REFERENCE

[Patent Document 1] Japanese Published Patent Application No. 2012-256400

SUMMARY OF THE INVENTION

An object of one embodiment of the present invention is to provide a novel semiconductor device or the like.

Another object of one embodiment of the present invention is to provide a semiconductor device or the like that has a novel structure and is high in data writing speed. Another object of one embodiment of the present invention is to provide a semiconductor device or the like with a novel structure, which reduces power consumption.

Note that the objects of the present invention are not limited to the above objects. The objects described above do not preclude the existence of other objects. The other objects are the ones that are not described above and will be described below. The other objects will be apparent from and can be derived from the description of the specification, the drawings, and the like by those skilled in the art. One embodiment of the present invention is to solve at least one of the aforementioned objects and the other objects.

One embodiment of the present invention is a semiconductor device including a first memory cell, a first wiring, a second wiring, and a switch. The first memory cell includes a first transistor, a second transistor, and a capacitor. The first wiring is configured to be supplied with a data voltage. The second wiring is configured to be supplied with the data voltage of the first wiring via the first transistor. The first memory cell is configured to be supplied with the data voltage of the second wiring via the second transistor. The first memory cell is capable of holding a charge corresponding to the data voltage at a node where one electrode of the capacitor, a gate of the first transistor, and one of a source and a drain of the second transistor are electrically connected. The first memory cell is electrically connected to the first wiring. The second memory cell is electrically connected to the first wiring. The first memory cell is electrically connected to the second wiring. The second memory cell is electrically connected to the second wiring. The switch is provided between the second wiring electrically connected to the first memory cell and the second wiring electrically connected to the second memory cell. The switch is capable of being turned off during a period in which the charge corresponding to the data voltage is supplied to the node of the first memory cell.

Note that other embodiments of the present invention will be described in the following embodiments and the drawings.

According to one embodiment of the present invention, a semiconductor device or the like with a novel structure can be provided.

Furthermore, according to one embodiment of the present invention, a semiconductor device or the like that has a novel structure and is high in data writing speed can be provided. Furthermore, according to one embodiment of the present invention, a semiconductor device or the like with a novel structure, which reduces power consumption, can be provided.

BRIEF DESCRIPTION OF THE DRAWINGS

In the accompanying drawings:

FIGS. 9A and 9B are high-resolution cross-sectional TEM images and FIG. 9C is a local Fourier transform image of an oxide semiconductor;

DETAILED DESCRIPTION OF THE INVENTION

Figure 1:
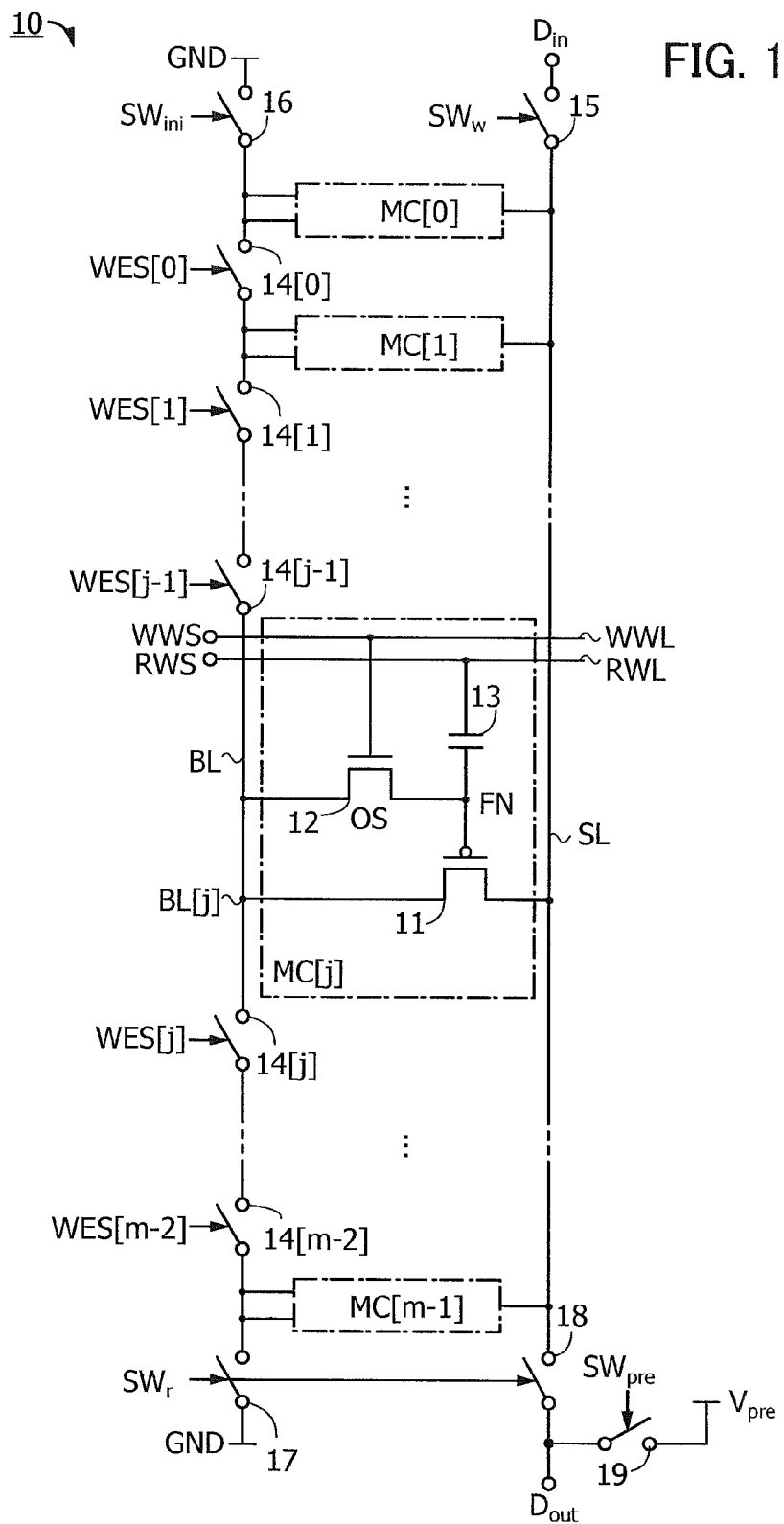
FIG. 1 is a circuit diagram for describing one embodiment of the present invention.

Hereinafter, embodiments will be described with reference to the drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, the following can be included: variation in signal, voltage, or current due to noise or difference in timing.

In this specification and the like, a transistor is an element having at least three terminals: a gate, a drain, and a source. A transistor includes a channel region between the drain (a drain terminal, a drain region, or a drain electrode) and the source (a source terminal, a source region, or a source electrode) and current can flow through the drain, the channel region, and the source.

Here, since the source and the drain of the transistor change depending on the structure, the operating condition, and the like of the transistor, it is difficult to define which is a source or a drain. Thus, a portion that functions as a source or a portion is not referred to as a source or a drain in some cases. In that case, one of the source and the drain might be referred to as a first electrode, and the other of the source and the drain might be referred to as a second electrode.

Note that in this specification, ordinal numbers such as "first", "second", and "third" are used in order to avoid confusion among components, and thus do not limit the number of the components.

Note that in this specification, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Note that in this specification, terms for describing arrangement, such as "over" and "under", are used for convenience for describing the positional relation between components with reference to drawings. Further, the positional relation between components is changed as appropriate in accordance with a direction in which each component is described. Thus, there is no limitation on terms used in this specification, and description can be made appropriately depending on the situation.

Note that the layout of circuit blocks in a block diagram in a drawing specifies the positional relation for description. Thus, even when a drawing shows that different functions are achieved in different circuit blocks, an actual circuit block may be configured so that the different functions are achieved in the same circuit block. The functions of circuit blocks in diagrams are specified for description, and even in the case where one circuit block is illustrated, blocks might be provided in an actual circuit block so that processing performed by one circuit block is performed by a plurality of circuit blocks.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, the term "perpendicular" indicates that the angle formed between two straight lines is greater than or equal to $80°$ and less than or equal to $100°$ and accordingly also includes the case where the angle is greater than or equal to $85°$ and less than or equal to $95°$.

In this specification, trigonal and rhombohedral crystal systems are included in a hexagonal crystal system.

Embodiment 1

In this embodiment, a structural example and operation of a memory cell MC that is a semiconductor device, and an example of a block diagram including the memory cell MC will be described.

In this specification and the like, a semiconductor device generally means a device that can function by utilizing semiconductor characteristics. Therefore, a memory cell composed of semiconductor elements such as transistors; peripheral circuits for controlling a memory cell; or the whole system including a memory cell, peripheral circuits, and the like is referred to as a semiconductor device.

<Structural Example of Memory Cell MC>

FIG. 1 shows a structural example of a semiconductor device 10 including memory cells MC.

In the structural example of the semiconductor device 10, m memory cells MC[0] to MC[m−1] (m is a natural number of 2 or more) provided in a column direction are shown.

The memory cells MC[0] to MC[m−1] each include a transistor 11, a transistor 12, and a capacitor 13. For the memory cells MC[0] to MC[m−1] provided in m rows, the j-th (j is a natural number of m−1 or less) memory cell in particular is shown as a memory cell MC[j] in FIG. 1.

In addition to the memory cells MC[0] to MC[m−1], switches 14[0] to 14[m−2], a switch 15, a switch 16, a switch 17, a switch 18, a switch 19, a wiring SL, a wiring BL, a wiring WWL, and a wiring RWL are included in the structural example of the semiconductor device 10.

Input data $D_{in}$ (also referred to as write data) is supplied to the wiring SL by the control of the switch 15. The on/off state of the switch 15 is controlled by a write signal $SW_w$. A potential of the wiring SL is output to the outside as output data $D_{out}$ (also referred to as read data) by the control of the switch 18. The on/off state of the switch 18 is controlled by a read signal $SW_r$. For the potential of the wiring SL, a precharge voltage $V_{pre}$ is supplied by the control of the switches 18 and 19. The on/off state of the switch 19 is controlled by a precharge control signal $SW_{pre}$. Note that the wiring SL may be referred to as a source line or a first wiring.

A ground potential GND is supplied to the wiring BL by the control of the switches 14[0] to 14[m−2] and the switch 16. The on/off state of the switches 14[0] to 14[m−2] is controlled by write control signals WES[0] to WES[m−2]. The on/off state of the switch 16 is controlled by an initialization signal $SW_{ini}$. The ground potential GND is supplied to the wiring BL by the control of the switch 17. The on/off state of the switch 17 is controlled by the read signal $SW_r$. Note that the wiring BL may be referred to as a bit line or a second wiring.

The memory cells MC[0] to MC[m−1] are provided between the wiring SL and the wiring BL. The connection between the transistor 11, the transistor 12, and the capacitor 13 in the memory cell MC[j] will be described. Note that in the following description, a memory cell is referred to simply as "memory cell MC" without sequential numbering, when a specific memory cell is not mentioned. The same applies to the switches 14 and the signals such as the write control signals WES.

A gate of the transistor 11 is connected to one of a source and a drain of the transistor 12 and one electrode of the capacitor 13. One of a source and a drain of the transistor 11 is connected to the wiring SL. The other of the source and the drain of the transistor 11 is connected to the wiring BL.

In the description of FIG. 1, the transistor 11 is regarded as a p-channel transistor. The transistor 11 may be an n-channel transistor. Furthermore, the transistor 11 is preferably a transistor using silicon in its channel region (hereinafter, Si transistor). With the use of a Si transistor as the transistor 11, variation in threshold voltage can be reduced and the amount of current flow can be increased.

In FIG. 1, a node where one electrode of the capacitor 13 is connected to the gate of the transistor 11 (i.e., the one of the source and the drain of the transistor 12) is referred to as a node FN. A potential of the node FN is changed by being supplied with the potential of the wiring BL via the transistor 12 or by the capacitive coupling caused by change in the potential of the wiring RWL while the node FN is in an electrically floating state.

The on/off state of the transistor 11 is controlled in accordance with the potential of the node FN. The transistor 11 is turned on when the absolute value of a voltage between the gate and the source (hereinafter, $V_{gs}$) exceeds the threshold voltage, and current flows therethrough. As a result, the potential of the wiring BL becomes a potential ($V_{in}$-$V_{th}$) that is lower than the voltage of the input data $D_{in}$ (also referred to as $V_{in}$, or data voltage), which is the potential of the wiring SL, by the threshold voltage of the transistor 11.

A gate of the transistor 12 is connected to the wiring WWL. One of the source and the drain of the transistor 12 is connected to the node FN. The other of the source and the drain of the transistor 12 is electrically connected to the wiring BL.

In the description of FIG. 1, the transistor 12 is regarded as an n-channel transistor. The transistor 12 may be a p-channel transistor. Furthermore, the transistor 12 is preferably a transistor using an oxide semiconductor in its channel region (hereinafter, OS transistor). With the use of an OS transistor as the transistor 12, off-state current that flows between the source and the drain when the transistor is off can be lowered.

In the circuit diagrams, the sign of "OS" is given to OS transistors to indicate that they are OS transistors.

The on/off state of the transistor 12 is controlled in accordance with a potential of the wiring WWL. The transistor 12 in an on state can set the potential of the node FN to the potential of the wiring BL, and the transistor 12 in an off state can set the node FN in an electrically floating state. As a result, the node FN can hold a potential ($V_{in}$-$V_{th}$) that is lower than the voltage of the input data $D_{in}$ by the threshold voltage of the transistor 11.

One electrode of the capacitor 13 is connected to the node FN. The other electrode of the capacitor 13 is connected to the wiring RWL.

A write word signal WWS is supplied to the wiring WWL. The write word signal WWS is a signal that turns on the transistor 12 when it is at an H level and turns off the transistor 12 when it is at an L level.

A read word signal RWS is supplied to the wiring RWL. The read word signal RWS is a signal that increases the potential of the node FN when it is at the H level and lowers the potential of the node FN when it is at the L level.

In the structure of FIG. 1, when the input data $D_{in}$ is written to the memory cell MC, the potential of the wiring BL becomes a potential ($V_{in}$-$V_{th}$) that is lower than the voltage of the input data $D_{in}$ by the threshold voltage. The time required for this potential change depends on the amount of parasitic capacitance of the wiring BL.

For example, when the wiring BL connected to the memory cell MC[j] is a wiring BL[j], the parasitic capacitance of the wiring BL[j] increases when the memory cells MC[0] to MC[m−1] are connected to the wiring BL[j]. This parasitic capacitance reduces the rate of change in the potential of the wiring BL.

In one embodiment of the present invention, in a structure where a potential is supplied to the node FN via the wirings SL and BL to write the input data $D_{in}$, the switches 14[0] to 14[m−2] provided on the wiring BL are turned off. Among the switches 14[0] to 14[m−2], at least switches 14 adjacent to the memory cell MC to which the input data Di is to be written are selectively turned off.

Figure 2:
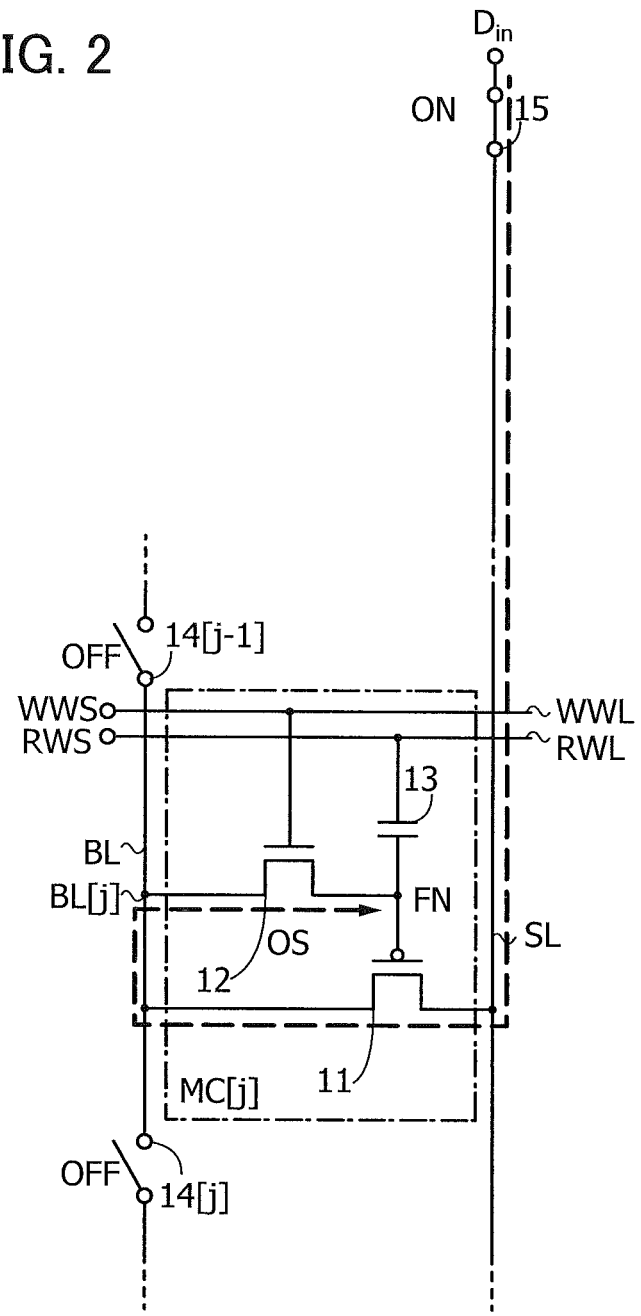
FIG. 2 is a circuit diagram for describing one embodiment of the present invention.

In the case where the input data $D_{in}$ is written to the memory cell MC[j] as shown in FIG. 2, for example, the switch 14[j−1] and the switch 14[j] that are adjacent to the memory cell MC[j] are turned off. The switches 14[0] to 14[m−2] are controlled such that the memory cell MC to which the input data $D_{in}$ is written is electrically isolated from the other memory cells that are connected to the wiring BL and are not written with the data.

In FIG. 2, current flow at the time when the input data $D_{in}$ is written to the node FN via the wirings SL and BL is indicated by a dashed arrow. As shown in FIG. 2, by turning off the switches 14[j−1] and 14[j], the memory cells MC[0] to MC[m−1] except the memory cell MC[j] are electrically isolated from the wiring BL[j]. Therefore, parasitic capacitance of the wiring BL[j] can be reduced.

Reduction in the parasitic capacitance of the wiring BL[j] can make the change in the potential sharp, whereby writing of the input data $D_{in}$ can be performed fast. The write control signals WES[0] to WES[m−2] are controlled such that a period in which the switches 14[j−1] and 14[j] are off includes a period in which the switch 15 is turned on to supply the voltage of the input data $D_{in}$ to the wiring SL.

According to one embodiment of the present invention, by turning off the switches 14[j−1] and 14[j], current consumed for changing the potential of the wiring BL can be reduced when a potential is supplied to the node FN via the wirings SL and BL to write the input data $D_{in}$. Thus, a reduction in power consumption can be achieved.

<Operation of Memory Cell MC>

Figure 3:
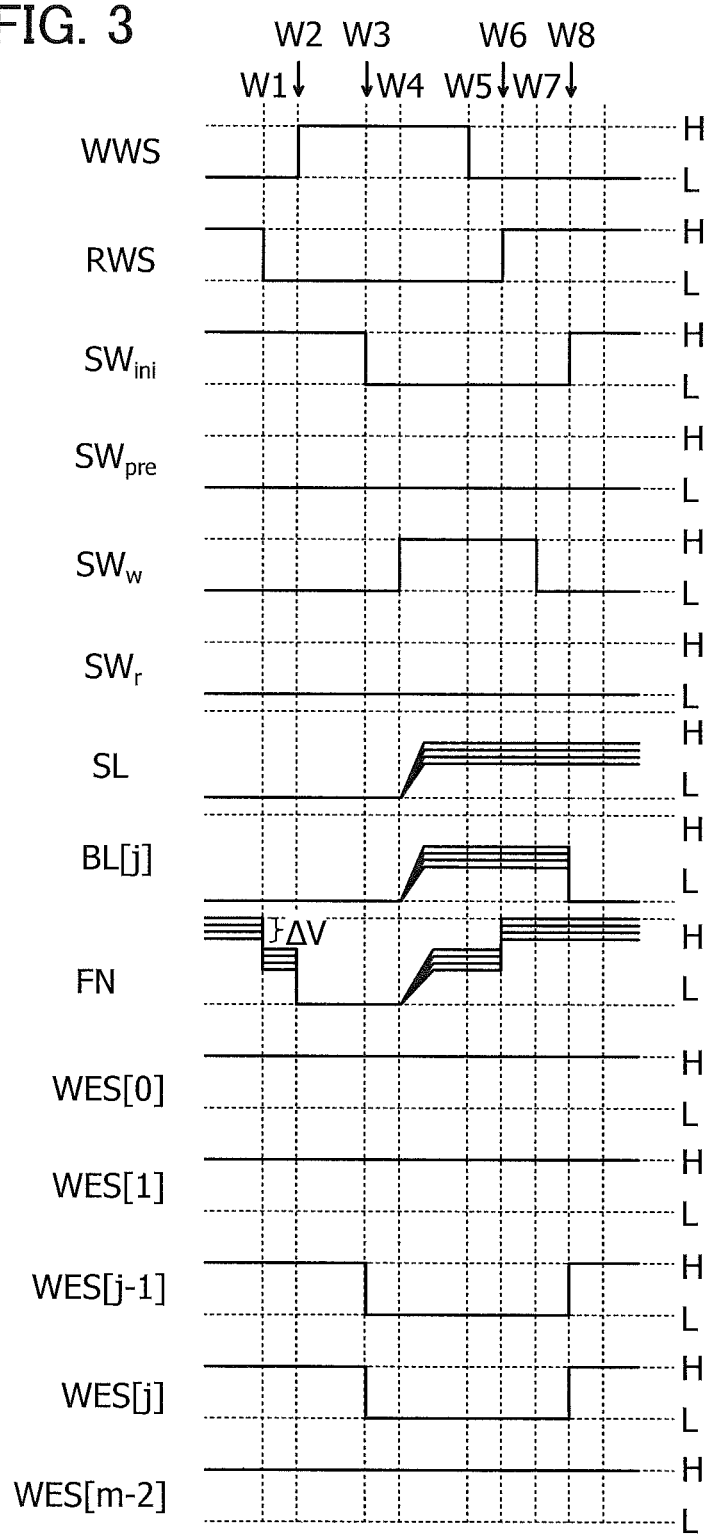
FIG. 3 is a timing chart for describing one embodiment of the present invention.

Next, the operation of the memory cell MC shown in FIG. 1 will be described. FIG. 3 shows a timing chart related to writing of the input data $D_{in}$ to the memory cell MC. Note that explanation will be made on the basis that each switch is turned on when a signal supplied thereto is at the H level and is turned off when a signal supplied thereto is at the L level.

According to the timing chart shown in FIG. 3, at a time W1, the read word signal RWS is set to the L level to lower the potential of the node FN. Note that at the node FN, any of a plurality of voltages (ΔV) is held. The plurality of voltages corresponds to multilevel data.

Next, at a time W2, the write word signal WWS is set to the H level to turn on the transistor 12, and the potential of the node FN is lowered to the L level that is the ground potential. Since the potential of the node FN becomes the L level, the transistor 11 is turned on.

The transistors 11 and 12 are kept on. At this point, an initialization operation before the input data $D_{in}$ is written to the memory cell MC is completed.

Next, at a time W3, the initialization signal $SW_{ini}$ is set to the L level, and the wiring for supplying the ground potential and the wiring BL[j] are electrically isolated from each other. Then, the control of the write control signals WES[0] to WES[m−2] is performed. In FIG. 3, writing of the input data $D_{in}$ to the memory cell MC[j] is described. Thus, the write control signals WES[0] to WES[m−2] are controlled such that the switches 14[j−1] and 14[j] are turned off. In FIG. 3, the write control signals WES[j−1] and WES[j] are set to the L level, and the other write control signals are set to the H level. Then, the wiring BL[f] is electrically isolated from the other memory cells MC.

Next, at a time W4, the write signal $SW_w$ is set to the H level, and a voltage corresponding to the multilevel data is supplied to the wiring SL. Since the transistors 11 and 12 are on, the potential of the wiring BL[j] and the potential of the node FN change. As described above, the potentials of the wiring BL[j] and the node FN each become a potential ($V_{in}$-$V_{th}$) that is lower than the voltage ($V_{in}$) of the input data $D_{in}$ by the threshold voltage of the transistor 11. Due to the reduction in the parasitic capacitance described above, change in the potential of the wiring BL[j] can be sharp and writing of the input data $D_{in}$ can be performed fast.

Next, at a time W5, the write word signal WWS is set to the L level to turn off the transistor 12. The node FN is brought into an electrically floating state while holding the charge corresponding to the voltage of the input data $D_{in}$.

Next, at a time W6, the read word signal RWS is set to the H level. The node FN is in an electrically floating state because the transistor 12 is off. Therefore, the potential of the node FN rises because of the capacitive coupling of the capacitor 13. Then, the transistor 11 is turned off.

Next, at a time W7, the write signal $SW_w$ is set to the L level. At this point, the writing operation of the input data $D_{in}$ to the memory cell MC is completed.

Next, at a time W8, the initialization signal $SW_{ini}$ is set to the H level, the write control signals WES[j−1] and WES[j] are set to the H level, and the wiring BL[j] is set to the L level that is the ground potential. The potential of the wiring SL may be set to the L level at the same timing. In order to set the wiring SL to the L level, another switch may be provided such that the wiring SL is connected to the wiring for supplying the ground potential.

Through the above-described sequence, writing of the input data Di can be performed. The input data $D_{in}$ written to the node FN of the memory cell MC can be held while the transistor 12 is kept off.

Figure 4:
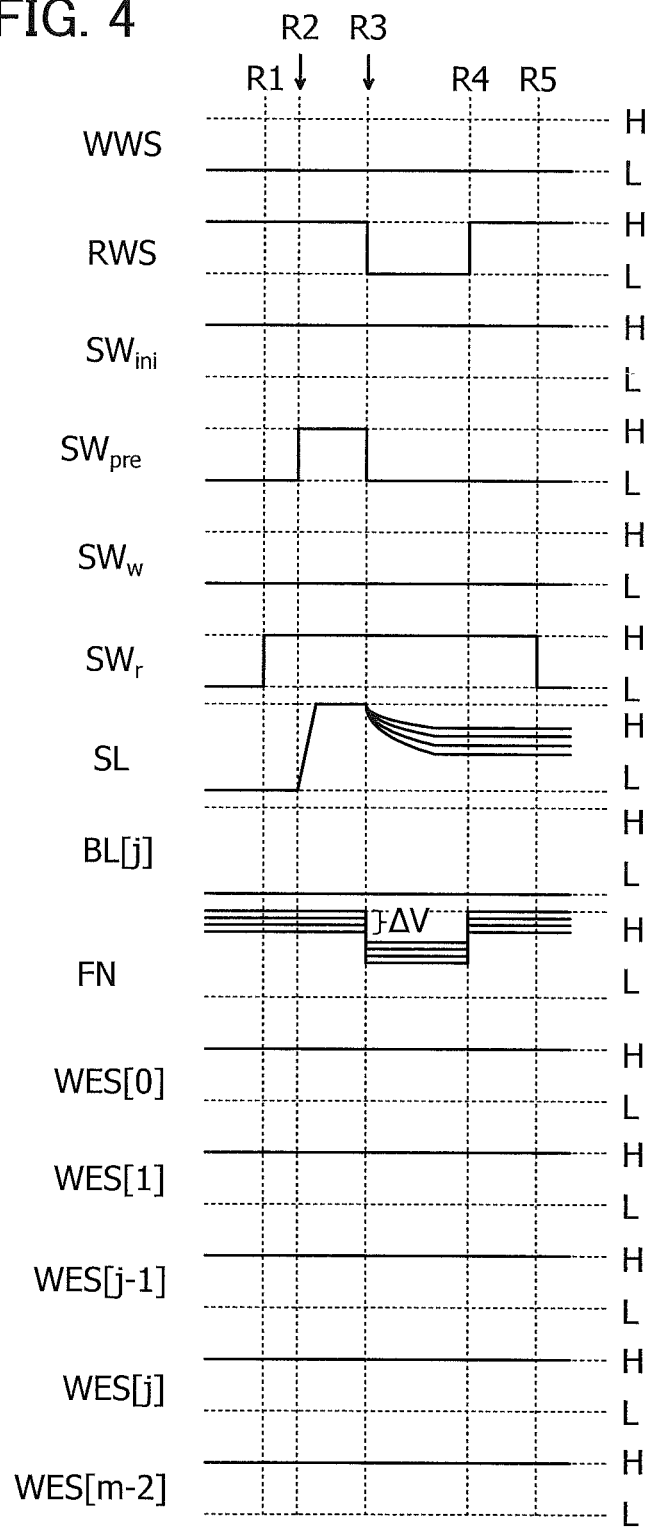
FIG. 4 is a timing chart for describing one embodiment of the present invention.

FIG. 4 shows a timing chart related to reading of the output data $D_{out}$ from the memory cell MC. At the time of reading the output data $D_{out}$, the write control signals WES[0] to WES[m−2] are set to the H level.

According to the timing chart shown in FIG. 4, at a time R1, the read signal $SW_r$ is set to the H level.

Next, at a time R2, the precharge control signal $SW_{pre}$ is set to the H level to set the wiring SL to the H level that is the precharge voltage $V_{pre}$.

Next, at a time R3, the precharge control signal $SW_{pre}$ is set to the L level such that the wiring SL is brought into an electrically floating state. Then, the read word signal RWS is set to the L level to lower the potential of the node FN. Thus, current flows through the transistor 11 in accordance with the potential of the node FN, and the potential of the wiring SL changes.

At a time R4, $V_{gs}$ of the transistor 11 becomes the threshold voltage and current flowing through the transistor 11 is lowered; accordingly, change in the potential of the wiring SL stops.

Owing to the change in the potential of the wiring SL, the voltage $V_{out}$ of the output data $D_{out}$ obtained at the wiring SL becomes the potential $V_{in}$ that is the sum of the potential of the node FN ($V_{in}$-$V_{th}$) and the threshold voltage $V_{th}$ of the transistor 11. That is, the potential obtained by canceling the term of the threshold voltage of the transistor 11 can be obtained as the voltage $V_{out}$ of the output data $D_{out}$.

Therefore, for the voltage $V_{in}$ of the input data Dm and the voltage $V_{out}$ of the output data $D_{out}$, the fluctuation range of the potential can be reduced. As a result, the node FN can hold a plurality of voltages. That is, holding of multilevel data can be easily achieved.

Furthermore, since the fluctuation range of the potential can be reduced, a verify operation to see whether the input data is accurately written can be omitted in one embodiment of the present invention. Therefore, writing of the input data can be performed faster.

Next, at a time R4, the read word signal RWS is set to the H level to turn off the transistor 11.

Next, at a time R5, the read signal SW$_r$ is set to the L level.

Through the above-described sequence, reading of data can be performed.

<Block Diagram>

Figure 5:
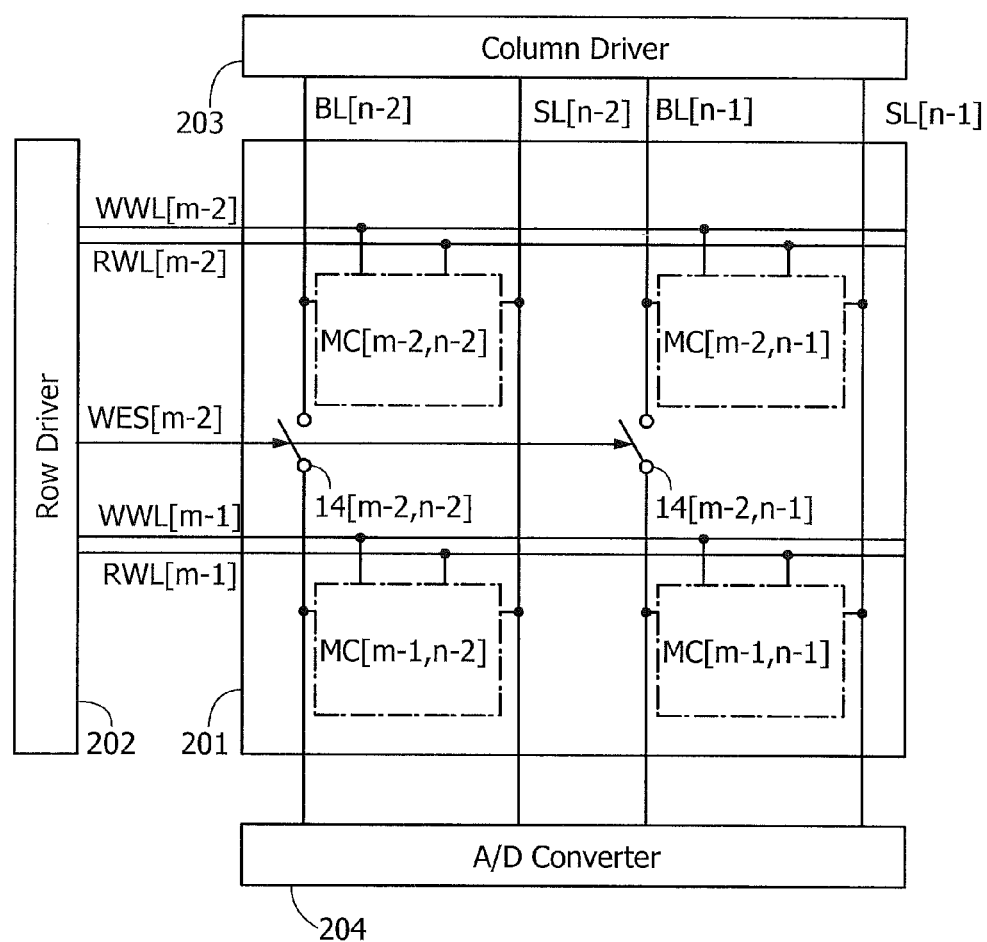
FIG. 5 is a block diagram for describing one embodiment of the present invention.

The above-described memory cell MC may operate with a structure in the block diagram shown as an example in FIG. 5.

A semiconductor device 200 shown in FIG. 5 includes a memory cell array 201 including a memory cell MC[m−2, n−2], a memory cell MC[m−1, n−2], a memory cell MC[m−2, n−1], and a memory cell MC[m−1, n−1] provided in a matrix.

The memory cell array 201 includes, in addition to the memory cells MC, a wiring WWL[m−2], a wiring WWL[m−1], a wiring RWL[m−2], a wiring RWL[m−1], a wiring BL[n−2], a wiring BL[n−1], a wiring SL[n−2], a wiring SL[n−1], a switch 14[m−2, n−2] and a switch 14[m−2, n−1]. A write control signal WES[m−2] is supplied to the switch 14[m−2, n−2] and the switch 14[m−2, n−1].

The memory cell array 201 includes a row driver 202, a column driver 203, and an A/D converter 204, for example.

The row driver 202 outputs signals supplied to the wiring WWL[m−2], the wiring WWL[m−1], the wiring RWL[m−2], and the wiring RWL[m−1], and the write control signal WES[m−2].

The column driver 203 outputs signals for writing the input data Di to the memory cells MC to the wiring BL[n−2], the wiring BL[n−1], the wiring SL[n−2], and the wiring SL[n−1].

The A/D converter 204 outputs signals for reading the output data D$_{out}$ from the memory cells MC to the wiring BL[n−2], the wiring BL[n−1], the wiring SL[n−2], and the wiring SL[n−1]. Furthermore, the A/D converter 204 has a function of converting the output data D$_{out}$ having multilevel data into digital data and outputting the digital data.

Note that although the case where the circuit structure described in this embodiment is used for a memory cell is described as an example, one embodiment of the present invention is not limited thereto. Depending on circumstances or conditions, the circuit structure of one embodiment of the present invention can be used for a circuit other than a memory cell. As examples of a circuit other than a memory cell, a logic circuit and a switch can be given.

Furthermore, although in this embodiment the case where a transistor including an oxide semiconductor is used in the circuit structure is described as an example, one embodiment of the present invention is not limited thereto. Depending on circumstances, a transistor which includes a semiconductor material that is not an oxide semiconductor may be employed in one embodiment of the present invention. As such a transistor, a transistor including silicon or germanium can be used in one embodiment of the present invention.

Note that the structures, methods, and the like described in this embodiment can be used as appropriate in combination with any of the structures, methods, and the like described in the other embodiments.

Embodiment 2

In this embodiment, other arrangement examples of the switches 14 described in Embodiment 1, other structure examples of the circuit that constitutes the memory cell MC, and specific examples of the circuit that constitutes the switch 14 will be described.

<Circuit Structure Examples of Memory Cell MC>

FIGS. 6A to 6D each show an example of the circuit structure that the memory cell MC described in Embodiment 1 can employ.

Figure 6A:
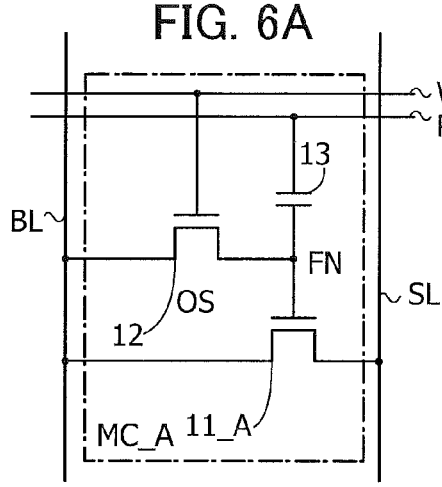
FIGS. 6A to 6D are circuit diagrams for describing embodiments of the present invention.

A memory cell MC_A shown in FIG. 6A includes a transistor 11_A, the transistor 12, and the capacitor 13. The transistor 11_A is an n-channel transistor. The structure in FIG. 6A can be used for the memory cells MC in FIG. 1.

Figure 6B:
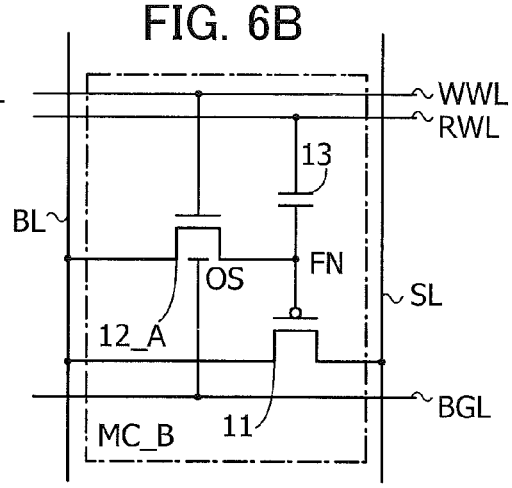

A memory cell MC_B shown in FIG. 6B includes the transistor 11, a transistor 12_A, and the capacitor 13. The transistor 12_A includes a back gate that can be controlled by a wiring BGL. With this structure, the threshold voltage of the transistor 12_A can be controlled. The structure in FIG. 6B can be used for the memory cells MC in FIG. 1.

Figure 6C:
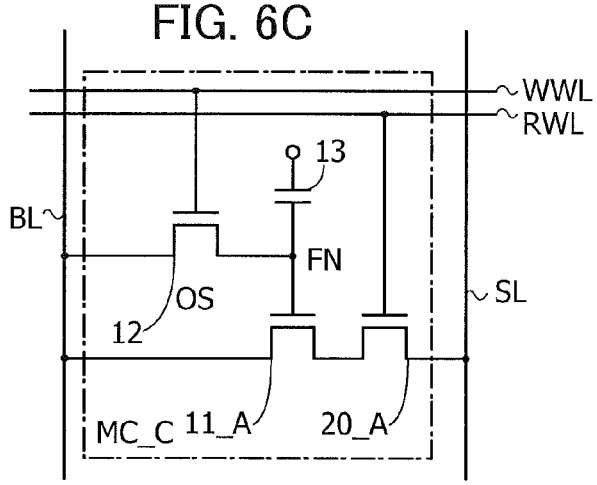

A memory cell MC_C shown in FIG. 6C includes the transistor 11_A, the transistor 12, the capacitor 13, and a transistor 20_A. The transistor 20_A is an n-channel transistor as with the transistor 11_A. The structure in FIG. 6C can be used for the memory cells MC in FIG. 1.

Figure 6D:
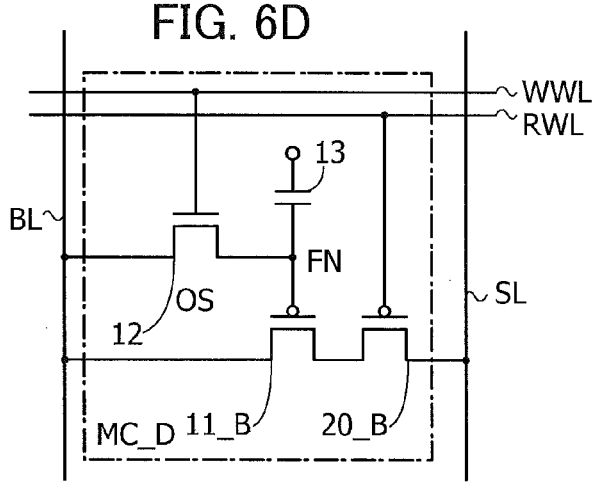

A memory cell MC_D shown in FIG. 6D includes a transistor 11_B, the transistor 12, the capacitor 13, and a transistor 20_B. The transistor 11_B and the transistor 20_B are p-channel transistors. The structure in FIG. 6D can be used for the memory cells MC in FIG. 1.

<Specific Examples of Switch 14>

FIGS. 7A to 7E each show an example of a circuit structure that the switch 14 described with reference to FIG. 1 can employ. FIGS. 7A to 7E each show the switch 14 as a switch between a wiring BL[j] and a wiring BL[j+1] that can be electrically isolated from the wiring BL[j].

Figure 7A:
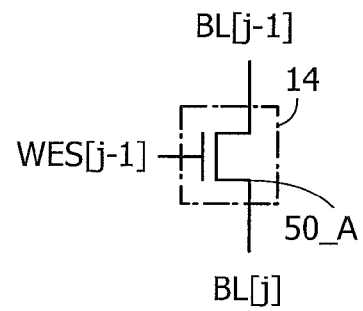
FIGS. 7A to 7E are circuit diagrams for describing embodiments of the present invention.

The switch 14 shown in FIG. 7A includes a transistor 50_A. The transistor 50_A is an n-channel transistor. The structure in FIG. 7A can be used for the switches 14 in FIG. 1.

Figure 7B:
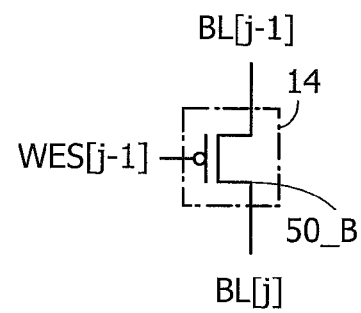

The switch 14 shown in FIG. 7B includes a transistor 50_B. The transistor 50_B is a p-channel transistor. The structure in FIG. 7B can be used for the switches 14 in FIG. 1.

Figure 7C:
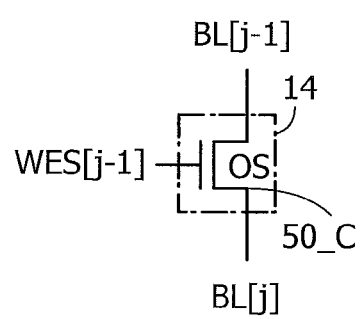

The switch 14 shown in FIG. 7C includes a transistor 50_C. The transistor 50_C is an OS transistor. The structure in FIG. 7C can be used for the switches 14 in FIG. 1.

Figure 7D:
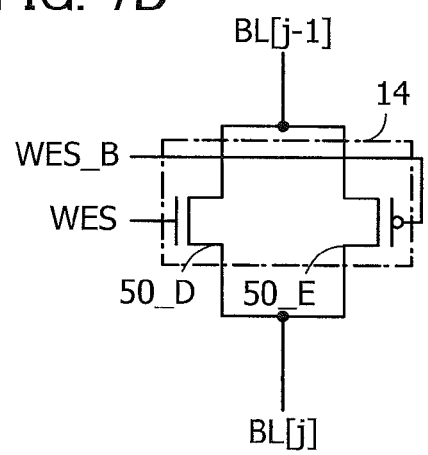

The switch 14 shown in FIG. 7D includes a transistor 50_D and a transistor 50_E. The transistor 50_D is an n-channel transistor and the transistor 50_E is a p-channel transistor. The control signal WES and a control signal WES_B that are inverted from each other are supplied to the transistor 50_D and the transistor 50E, respectively, to control the on/off state of the transistors 50_D and 50_E. The structure in FIG. 7D can be used for the switches 14 in FIG. 1.

Figure 7E:
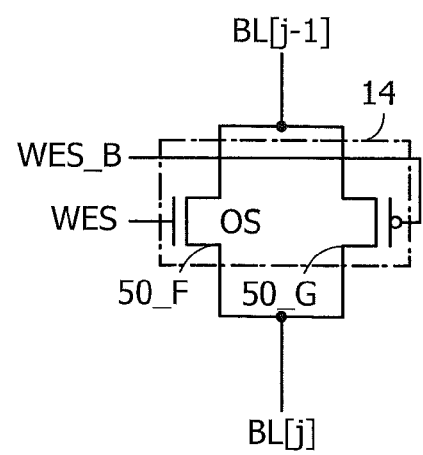

The switch 14 shown in FIG. 7E includes a transistor 50_F and a transistor 50_G. The transistor 50_F is an n-channel OS transistor and the transistor 50_G is a p-channel transistor. The structure in FIG. 7E can be used for the switches 14 in FIG. 1.

<Arrangement Examples of Switch 14>

In the structural example in FIG. 1, the switches 14 on the wiring BL are each positioned between the rows of the memory cells MC; however, one embodiment of the present invention is not limited to such a structure. Other arrangement examples are shown in FIGS. 8A and 8B.

Figure 8A:
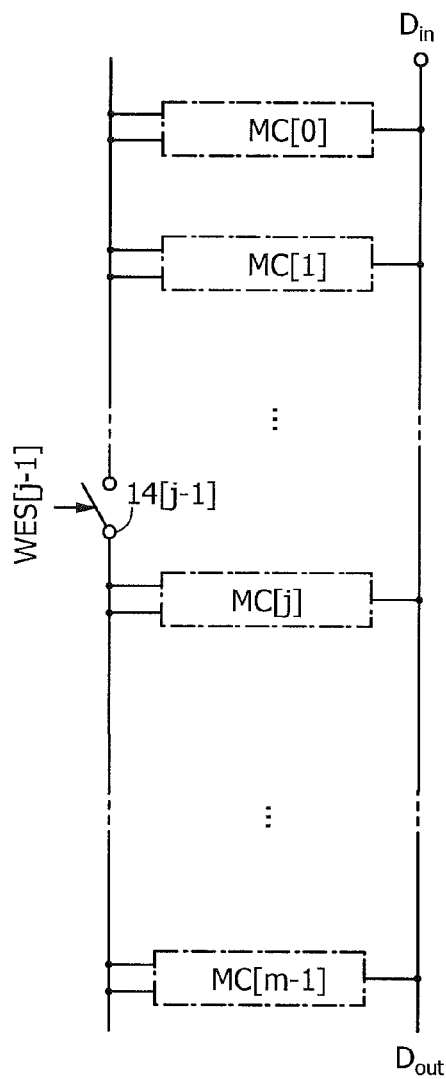
FIGS. 8A and 8B are circuit diagrams for describing embodiments of the present invention.

FIG. 8A shows a structural example in which only the switch 14[j−1] is provided as the switch 14 on the wiring BL. Even with this structure, parasitic capacitance of the wiring BL at the time of writing can be reduced. Accordingly, the structural example in FIG. 8A can be used for the semiconductor device in FIG. 1, in which case a semiconductor device with high-speed data writing can be obtained.

Figure 8B:
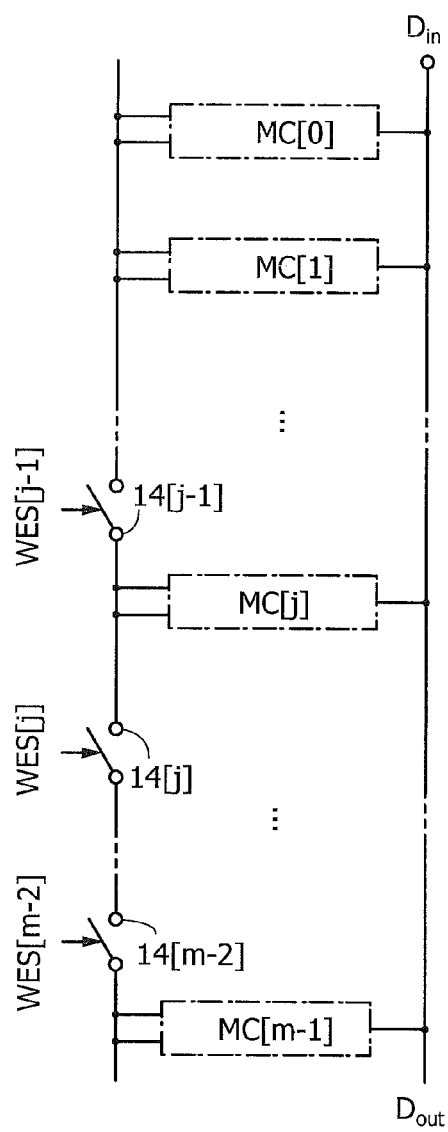

FIG. 8B shows a structural example in which the switch 14[j−1] and the switches 14 in the subsequent rows are provided as the switches 14 on the wiring BL. Even with this structure, parasitic capacitance of the wiring BL at the time of writing can be reduced. Accordingly, the structural example in FIG. 8B can be used for FIG. 1, in which case a semiconductor device that is high in data writing speed can be obtained.

Note that the structures, methods, and the like described in this embodiment can be used as appropriate in combination with any of the structures, methods, and the like described in the other embodiments.

Embodiment 3

In this embodiment, an OS transistor with a low off-state current mentioned in the above embodiments and an oxide semiconductor included in the semiconductor layer of the OS transistor will be described.
<OS Transistor>

An OS transistor mentioned in the above embodiments as a transistor with a low off-state current can achieve lower off-state current than that of a Si transistor.

The off-state current of an OS transistor can be reduced by reducing the concentration of impurities in an oxide semiconductor to make the oxide semiconductor intrinsic or substantially intrinsic. The term "substantially intrinsic" refers to the state where an oxide semiconductor has a carrier density lower than $1\times10^{17}/cm^3$, preferably lower than $1\times10^{15}/cm^3$, further preferably lower than $1\times10^{13}/cm^3$. In the oxide semiconductor, hydrogen, nitrogen, carbon, silicon, and a metal element other than a main component are impurities. For example, hydrogen and nitrogen contributes to the formation of donor levels to increase the carrier density.

A transistor using an intrinsic or substantially intrinsic oxide semiconductor has a low carrier density and thus is less likely to have negative threshold voltage. In addition, because of few carrier traps in the oxide semiconductor, the transistor including the oxide semiconductor has small variation in electrical characteristics and high reliability. Furthermore, a transistor including the oxide semiconductor can make the off-state current extremely low.

For example, the OS transistor with reduced off-state current can exhibit a normalized off-state current per micrometer in channel width of $1\times10^{-18}$ A or less, preferably $1\times10^{-21}$ A or less, more preferably $1\times10^{-24}$ A or less at room temperature (approximately 25° C.), or $1\times10^{-15}$ A or less, preferably $1\times10^{-18}$ A or less, more preferably $1\times10^{-21}$ A or less at 85° C.

Note that off-state current of an n-channel transistor refers to a current that flows between a source and a drain when the transistor is off. For example, the off-state current of an n-channel transistor with a threshold voltage of about 0 V to 2 V refers to current that flows between a source and a drain when a negative voltage is applied between a gate and the source.

Accordingly, in the memory cell MC, a charge can be held at the node FN with the transistor 12 that is an OS transistor being in an off state.

Furthermore, the OS transistor used in the memory cell MC is a transistor with favorable switching characteristics in addition to low off-state current.

Note that the OS transistor used in the memory cell MC is formed over an insulating surface. Therefore, unlike a Si transistor that uses a semiconductor substrate as a channel formation region, parasitic capacitance is not generated between the gate electrode and a body or a semiconductor substrate. Consequently, with the use of an OS transistor, carriers can be controlled easily with a gate electric field, and favorable switching characteristics can be obtained.
<Oxide Semiconductor>

Next, an oxide semiconductor that can be used for a semiconductor layer of an OS transistor will be described.

An oxide semiconductor used for a channel formation region in the semiconductor layer of the transistor preferably contains at least indium (In) or zinc (Zn). In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor used for the semiconductor layer of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio of In:Ga:Zn=1:1:1, In:Ga:Zn=3:1:2, or In:Ga:Zn=2:1:3, or an oxide with an atomic ratio close to the above atomic ratios can be used.

When the oxide semiconductor film forming the semiconductor layer contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Accordingly, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, and treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) or substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

Thus, the transistor including an i-type or substantially i-type oxide semiconductor film can have extremely favorable off-state current characteristics.

A structure of the oxide semiconductor film will be described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film will be described.

The CAAC-OS film is one of oxide semiconductor films having a plurality of c-axis aligned crystal parts.

When observing the CAAC-OS film in a combined analysis image of a bright-field image and a diffraction pattern with the use of a transmission electron microscope (TEM) (the combined analysis image is also referred to as a high-resolution TEM image), a plurality of crystal parts can be found. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer has a form reflecting unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

According to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

FIG. 9A is a high-resolution cross-sectional TEM image of a CAAC-OS film. FIG. 9B is a high-resolution cross-sectional TEM image obtained by enlarging the image of FIG. 9A. In FIG. 9B, atomic arrangement is highlighted for easy understanding.

FIG. 9C is Fourier transform images of regions each surrounded by a circle (the diameter is about 4 nm) between A and O and between O and A' in FIG. 9A. C-axis alignment can be observed in each region in FIG. 9C. The c-axis direction between A and O is different from that between O and A', which indicates that a grain in the region between A and O is different from that between O and A'. In addition, between A and O, the angle of the c-axis continuously and gradually changes from 14.3°, 16.6° to 26.4°. Similarly, between O and A', the angle of the c-axis continuously changes from −18.3°, −17.6°, to −15.9°.

Note that in an electron diffraction pattern of the CAAC-OS film, spots (bright spots) having alignment are shown. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 10A).

From the results of the high-resolution cross-sectional TEM image and the high-resolution plan-view TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 $nm^2$ or more, 5 $\mu m^2$ or more, or 1000 $\mu m^2$ or more is observed in some cases in the high-resolution plan-view TEM image.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. In contrast, in the case of a CAAC-OS film, a peak is not clearly observed even when φ scan is performed with 2θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not necessarily be parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface may be higher than that in the vicinity of the formation surface. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has a negative threshold voltage (rarely has normally-on characteristics). Furthermore, the highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a polycrystalline oxide semiconductor film will be described.

In a high-resolution TEM image of the polycrystalline oxide semiconductor film, crystal grains are observed. In most cases, the crystal grain size in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in the high-resolution TEM image, for example. Moreover, in the high-resolution TEM image of the polycrystalline oxide semiconductor film, a grain boundary may be observed.

The polycrystalline oxide semiconductor film may include a plurality of crystal grains, and alignment of crystals may be different in the plurality of crystal grains. A polycrystalline oxide semiconductor film is subjected to structural analysis with an XRD apparatus. For example, when the polycrystalline oxide semiconductor film including an $InGaZnO_4$ crystal is analyzed by an out-of-plane method, peaks of $2\theta$ appear at around 31°, 36°, and the like in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, a transistor including the polycrystalline oxide semiconductor film has larger variation in electrical characteristics and lower reliability than a transistor including a CAAC-OS film in some cases.

Next, a microcrystalline oxide semiconductor film will be described.

A microcrystalline oxide semiconductor film has a region where a crystal part is observed in a high-resolution TEM image and a region where a crystal part is not clearly observed in a high-resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a high resolution TEM image of the nc-OS film, for example, a grain boundary cannot be found clearly in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in a selected-area electron diffraction pattern of the nc-OS film obtained by using an electron beam having a probe diameter (e.g., 50 nm or larger) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Furthermore, in a nanobeam electron diffraction pattern of the nc-OS film, a plurality of circumferentially distributed spots may be observed (see FIG. 10B).

The nc-OS film is an oxide semiconductor film that has higher regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Thus, the nc-OS film may have a higher carrier density than the CAAC-OS film. The oxide semiconductor film having a high carrier density may have high electron mobility. Thus, a transistor including the nc-OS film may have high field-effect mobility. The nc-OS film has a higher defect state density than the CAAC-OS film, and thus may have a lot of carrier traps. Consequently, a transistor including the nc-OS film has larger variation in electrical characteristics and lower reliability than a transistor including the CAAC-OS film. The nc-OS film can be formed easily as compared to the CAAC-OS film because nc-OS film can be formed even when a relatively large amount of impurities are included; thus, depending on the purpose, the nc-OS film can be favorably used in some cases. Therefore, a memory device including the transistor including the nc-OS film can be manufactured with high productivity in some cases.

Next, an amorphous oxide semiconductor film will be described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear.

A halo pattern is shown in an electron diffraction pattern of the amorphous oxide semiconductor film. Further, a halo pattern is shown but a spot is not shown in a nanobeam electron diffraction pattern of the amorphous oxide semiconductor film.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Accordingly, the amorphous oxide semiconductor film has a much higher carrier density than the nc-OS film. Therefore, a transistor including the amorphous oxide semiconductor film tends to be normally on. Thus, in some cases, such an amorphous oxide semiconductor layer can be used for a transistor which needs to be normally on. Since the amorphous oxide semiconductor film has a high density of defect states, carrier traps might be increased.

Consequently, a transistor including the amorphous oxide semiconductor film has larger variation in electrical characteristics and lower reliability than a transistor including the CAAC-OS film or the nc-OS film.

Next, a single-crystal oxide semiconductor film will be described.

The single-crystal oxide semiconductor film has a lower impurity concentration and a lower density of defect states (few oxygen vacancies). Thus, the carrier density can be decreased. Accordingly, a transistor including the single-crystal oxide semiconductor film is unlikely to be normally on. Moreover, since the single-crystal oxide semiconductor film has a lower impurity concentration and a lower density of defect states, carrier traps might be reduced. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (amorphous-like OS) film.

In a high-resolution TEM image of the amorphous-like OS film, a void may be seen. Furthermore, in the high-resolution TEM image, there are a region where a crystal part is clearly observed and a region where a crystal part is not observed. In the amorphous-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the amorphous-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes in which the spacing therebetween is from 0.28 nm to 0.30 nm is regarded to correspond to the a-b plane of the InGaZnO$_4$ crystal, focusing on the lattice fringes in the high-resolution TEM image. The maximum length of the region in which the lattice fringes are observed is regarded as the size of the crystal parts of the amorphous-like OS film and the nc-OS film. Note that the crystal part whose size is 0.8 nm or larger is selectively evaluated.

Figure 11:
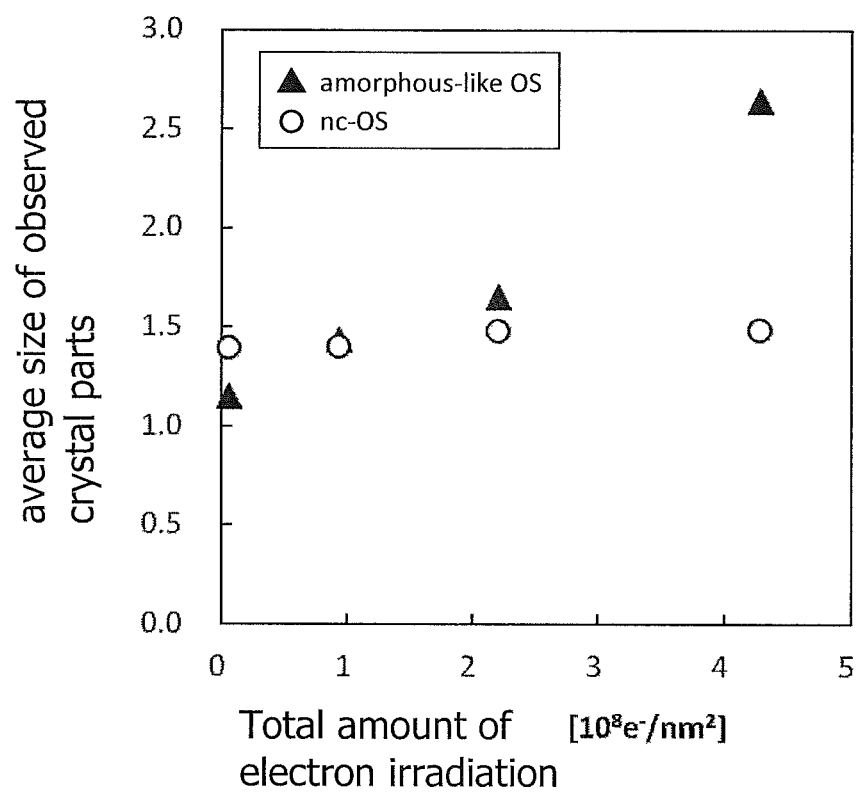
FIG. 11 shows a change in crystal part induced by electron irradiation.

FIG. 11 shows examination results of change in average size of crystal parts (20☐☐☐☐40 points) in the amorphous-like OS film and the nc-OS film using the high-resolution TEM images. As in FIG. 11, the crystal part size in the amorphous-like OS film increases with an increase of the total amount of electron irradiation. Specifically, the crystal part of approximately 1.2 nm at the start of TEM observation grows to a size of approximately 2.6 nm at the total amount of electron irradiation of $4.2 \times 10^8 e^-/nm^2$. In contrast, the crystal part size in the good-quality nc-OS film shows little change from the start of electron irradiation to the total amount of electron irradiation of $4.2 \times 10^8 e^-/nm^2$ regardless of the amount of electron irradiation.

Furthermore, in FIG. 11, by linear approximation of the change in the crystal part size in the amorphous-like OS film and the nc-OS film and extrapolation to the total amount of electron irradiation of $0 e^-/nm^2$, the average size of the crystal part is found to be a positive value. This means that the crystal parts exist in the amorphous-like OS film and the nc-OS film before TEM observation.

Note that an oxide semiconductor film may be a stacked film including two or more kinds of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

Figure 10A:
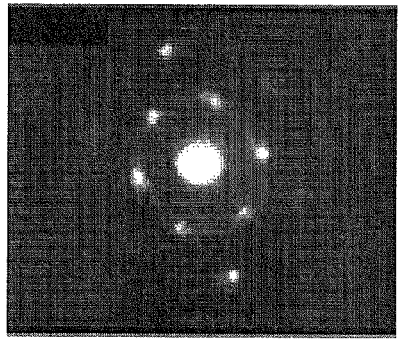
FIGS. 10A and 10B show nanobeam electron diffraction patterns of oxide semiconductor films.
Figure 10B:
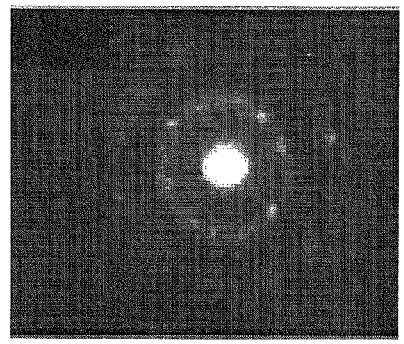
Figure 10C:
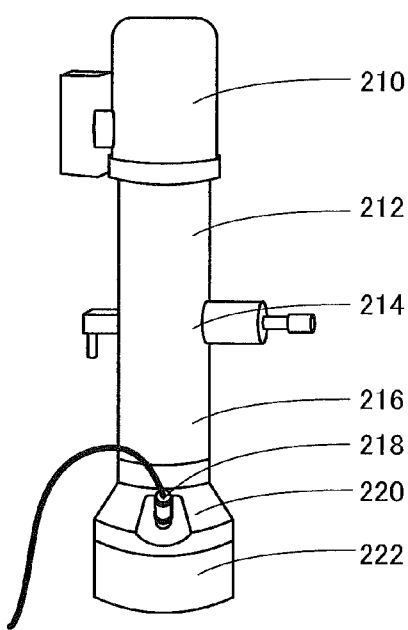
FIGS. 10C and 10D illustrate an example of a transmission electron diffraction measurement apparatus.

FIG. 10C illustrates a transmission electron diffraction measurement apparatus which includes an electron gun chamber 210, an optical system 212 below the electron gun chamber 210, a sample chamber 214 below the optical system 212, an optical system 216 below the sample chamber 214, an observation chamber 220 below the optical system 216, a camera 218 installed in the observation chamber 220, and a film chamber 222 below the observation chamber 220. The camera 218 is provided to face toward the inside of the observation chamber 220. Note that the film chamber 222 does not necessarily have to be provided.

Figure 10D:
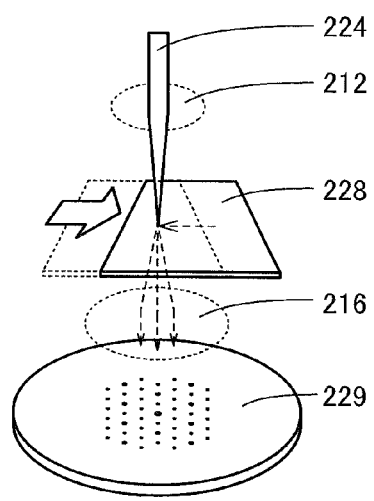

FIG. 10D illustrates an internal structure of the transmission electron diffraction measurement apparatus illustrated in FIG. 10C. In the transmission electron diffraction measurement apparatus, a substance 228 which is positioned in the sample chamber 214 is irradiated with electrons emitted from an electron gun installed in the electron gun chamber 210 through the optical system 212. Electrons passing through the substance 228 are incident on a fluorescent plate 229 provided in the observation chamber 220 through the optical system 216. On the fluorescent plate 229, a pattern corresponding to the intensity of the incident electrons appears, which allows measurement of a transmission electron diffraction pattern.

The camera 218 is installed so as to face the fluorescent plate 229 and can take an image of a pattern appearing on the fluorescent plate 229. An angle formed by a straight line which passes through the center of a lens of the camera 218 and the center of the fluorescent plate 229 and an upper surface of the fluorescent plate 229 is, for example, 15° or more and 80° or less, 30° or more and 75° or less, or 45° or more and 70° or less. As the angle is reduced, distortion of the transmission electron diffraction pattern taken by the camera 218 becomes larger. Note that if the angle is obtained in advance, the distortion of an obtained transmission electron diffraction pattern can be corrected. Note that the film chamber 222 may be provided with the camera 218. For example, the camera 218 may be set in the film chamber 222 so as to be opposite to the incident direction of electrons 224. In this case, a transmission electron diffraction pattern with less distortion can be taken from the rear surface of the fluorescent plate 229.

A holder for fixing the substance 228 that is a sample is provided in the sample chamber 214. Electrons which passes through the substance 228 penetrate the holder. The holder may have, for example, a function of moving the substance 228 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 228.

Next, a method for measuring a transmission electron diffraction pattern of a substance by the transmission electron diffraction measurement apparatus described above will be described.

For example, changes in the structure of a substance can be observed by changing the irradiation position of the electrons 224 that are a nanobeam on the substance (or by scanning) as illustrated in FIG. 10D. At this time, when the substance 228 is a CAAC-OS film, a diffraction pattern like the one shown in FIG. 10A is observed. When the substance 228 is an nc-OS film, a diffraction pattern like the one shown in FIG. 10B is observed.

Even when the substance 228 is a CAAC-OS film, a diffraction pattern similar to that of an nc-OS film or the like is partly observed in some cases. Therefore, whether or not a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, further preferably higher than or equal to 90%, still further preferably higher than or equal to 95%. Note that the proportion of a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 12A:
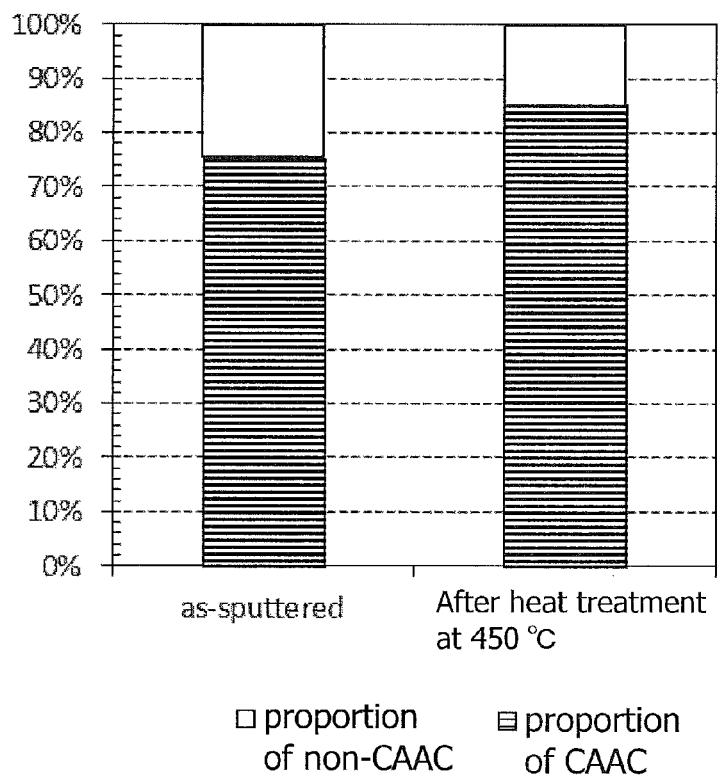
FIG. 12A shows an example of structural analysis by transmission electron diffraction measurement and FIGS. 12B and 12C show high-resolution plan-view TEM images.

FIG. 12A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%).

These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Further, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Further, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 12B:
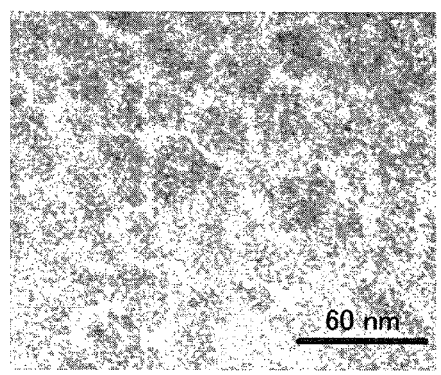
Figure 12C:
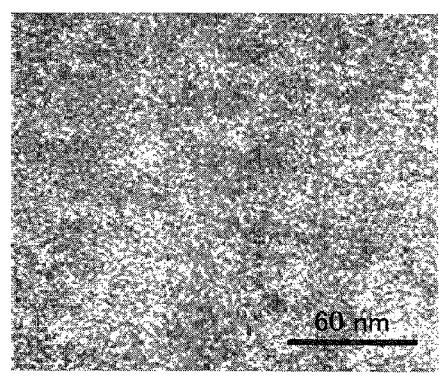

FIGS. 12B and 12C are high-resolution plan-view TEM images of the CAAC-OS film obtained just after the deposition and the CAAC-OS film subjected to the heat treatment at 450° C., respectively. Comparison between FIGS. 12B and 12C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

Note that the structures, methods, and the like described in this embodiment can be used as appropriate in combination with any of the structures, methods, and the like described in the other embodiments.

Embodiment 4

In this embodiment, examples of a layout, a circuit diagram and a cross-sectional structure corresponding to the layout, of the memory cell MC will be described with reference to FIGS. 13A and 13B and FIG. 14.

Figure 13A:
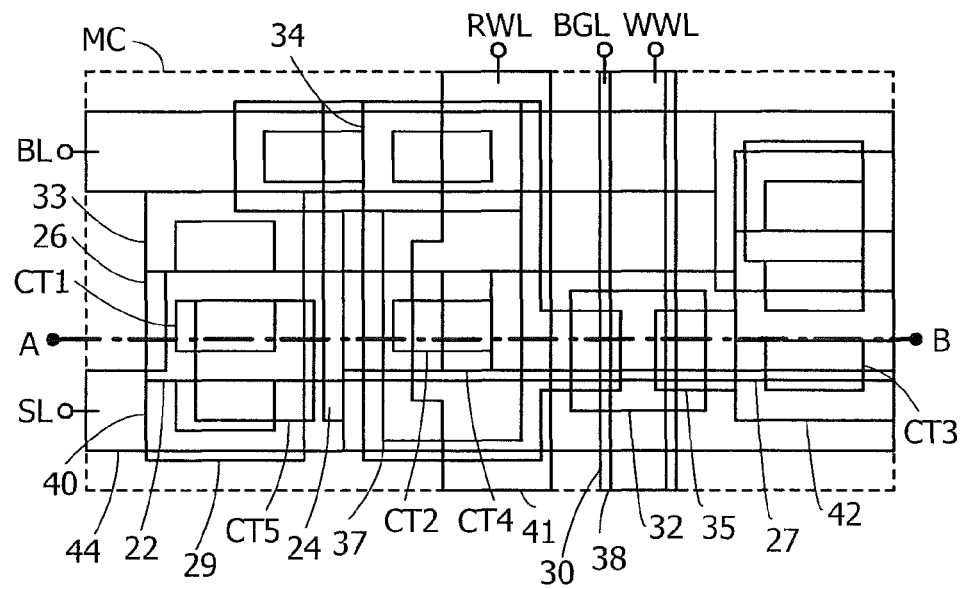
FIGS. 13A and 13B are a layout and a circuit diagram for describing one embodiment of the present invention.

FIG. 13A is a layout of the memory cell MC. FIG. 13B is a circuit diagram corresponding to the layout in FIG. 13A. Furthermore, the circuit diagram in FIG. 13B corresponds to the circuit diagram shown in FIG. 6B. FIG. 14 shows a cross section taken along a dashed-dotted line A-B in FIG. 13A.

Figure 14:
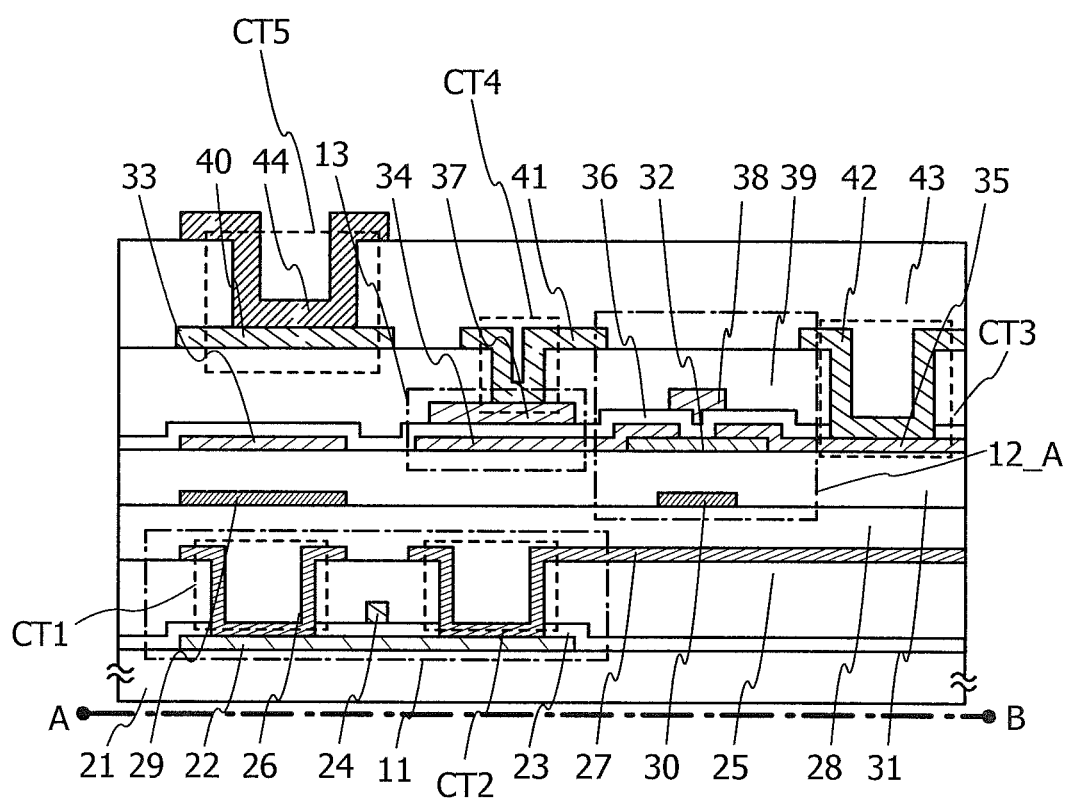
FIG. 14 is a cross-sectional view for describing one embodiment of the present invention.

FIG. 13A or FIG. 14 show a substrate 21, a semiconductor layer 22, an insulating layer 23, a conductive layer 24, an insulating layer 25, a conductive layer 26, a conductive layer 27, an insulating layer 28, a conductive layer 29, a conductive layer 30, an insulating layer 31, a semiconductor layer 32, a conductive layer 33, a conductive layer 34, a conductive layer 35, an insulating layer 36, a conductive layer 37, a conductive layer 38, an insulating layer 39, a conductive layer 40, a conductive layer 41, a conductive layer 42, an insulating layer 43, a conductive layer 44, and openings CT1 to CT5.

As the substrate 21, for example, a single-crystal silicon substrate (including a p-type semiconductor substrate or an n-type semiconductor substrate), a compound semiconductor substrate containing silicon carbide or gallium nitride, an SOI (silicon on insulator) substrate, a glass substrate, or the like can be used.

An amorphous semiconductor, a microcrystalline semiconductor, a polycrystalline semiconductor, or the like can be used for the semiconductor layers 22 and 32. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used.

In particular, the semiconductor layer 32 is preferably formed to have a single-layer or stacked-layer structure using an oxide semiconductor. The oxide semiconductor is an oxide film containing at least indium, gallium, and zinc, and can be formed using an In—Ga—Zn-based oxide (also expressed as IGZO). Note that the In—Ga—Zn-based oxide means an oxide containing In, Ga, and Zn, and may contain a metal element other than In, Ga, or Zn. For example, it is possible to use an In—Sn—Ga—Zn-based oxide, an In—Hf—Ga—Zn-based oxide, or an In—Al—Ga—Zn-based oxide.

The oxide semiconductor can be formed by a sputtering method, an atomic layer deposition (ALD) method, an evaporation method, a coating method, or the like.

The conductive layers 24, 26, 27, 29, 30, 33, 34, 35, 37, 38, 40, 41, 42, and 44 are each preferably formed using a metal material such as aluminum, copper, titanium, tantalum, and tungsten. Alternatively, polycrystalline silicon to which an impurity such as phosphorus is added can be used. As the formation method, a variety of film formation methods such as an evaporation method, a PE-CVD method, a sputtering method, and a spin coating method can be used.

The insulating layers 23, 25, 28, 31, 36, 39, and 43 are each preferably a single layer or a multilayer formed using an inorganic insulating layer or an organic insulating layer. The inorganic insulating layer is preferably a single layer or a multilayer formed using any of a silicon nitride film, a silicon oxynitride film, a silicon nitride oxide film, and the like. The organic insulating layer is preferably a single layer or a multilayer formed using polyimide, acrylic, and the like. There is no particular limitation on a method for forming each of the insulating layers; for example, a sputtering method, an MBE method, a PE-CVD method, a pulse laser deposition method, an ALD method, or the like can be employed as appropriate.

Note that in the case where an oxide semiconductor is used for the semiconductor layer 32, the insulating layers 31 and 36 in contact with the semiconductor layer 32 are each preferably a single layer or a multilayer formed using an inorganic insulating layer. In addition, the insulating layers 31 and 36 each preferably have an effect of supplying oxygen to the semiconductor layer 32.

The openings CT1 and CT2 are provided in the insulating layers 23 and 25 such that the conductive layers 26 and 27 are directly connected to the semiconductor layer 22. The opening CT3 is provided in the insulating layers 36 and 39 such that the conductive layer 35 is in direct contact with the conductive layer 42. The opening CT4 is provided in the insulating layer 39 such that the conductive layer 37 is in direct contact with the conductive layer 41. The opening CT5 is provided in the insulating layer 43 such that the conductive layer 40 is in direct contact with the conductive layer 44.

Note that as shown in the layout in FIG. 13A, it is preferable that the conductive layers 34 and 35 that are in contact with the semiconductor layer 32 not completely cover edges of the semiconductor layer 32. With such a structure, an area where the conductive layers 34 and 35 overlap with the conductive layers 30 and 38 decreases, whereby parasitic capacitance between the conductive layers can be reduced. Accordingly, change in the potentials of the conductive layers 34 and 35 due to change in the potentials of the conductive layers 30 and 38 can be suppressed.

Note that the structures, methods, and the like described in this embodiment can be used as appropriate in combination with any of the structures, methods, and the like described in the other embodiments.

Embodiment 5

Although the conductive layers and the semiconductor layers described in the above embodiments can be formed by a sputtering method, they may be formed by another method, for example, a thermal CVD method. As a thermal CVD method, a metal organic chemical vapor deposition (MOCVD) method or an atomic layer deposition (ALD) method may be employed, for example.

A thermal CVD method has an advantage that no defect due to plasma damage is generated since it does not utilize plasma for forming a film.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The conductive layers and the semiconductor layers disclosed in the above embodiments can be formed by a thermal CVD method such as a MOCVD method or an ALD method. For example, in the case where an InGaZnOx (X>0) film is formed, trimethylindium, trimethylgallium, and dimethylzinc are used. Note that the chemical formula of trimethylindium is $(CH_3)_3In$. The chemical formula of trimethylgallium is $(CH_3)_3Ga$. The chemical formula of dimethylzinc is $(CH_3)_2Zn$. Without limitation to the above combination, triethylgallium (chemical formula: $(C_2H_5)_3Ga$) can be used instead of trimethylgallium and diethylzinc (chemical formula: $(C_2H_5)_2Zn$) can be used instead of dimethylzinc.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an InGaZnOx (X>0) film is formed using a deposition apparatus employing ALD, an $In(CH_3)_3$ gas and an $O_3$ gas are sequentially introduced plural times to form an $InO_2$ layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an $InGaO_2$ layer, an $InZnO_2$ layer, a GanO layer, a ZnInO layer or a GaZnO layer may be formed by mixing these gases. Note that although an $H_2O$ gas which is obtained by bubbling with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

The structure described above in this embodiment can be combined as appropriate with any of the structures described in the other embodiments.

Embodiment 6

In this embodiment, application examples of the semiconductor device described in the above embodiments to an electronic component and to an electronic device including the electronic component will be described with reference to FIGS. 15A and 15B and FIGS. 16A to 16E.

Figure 15A:
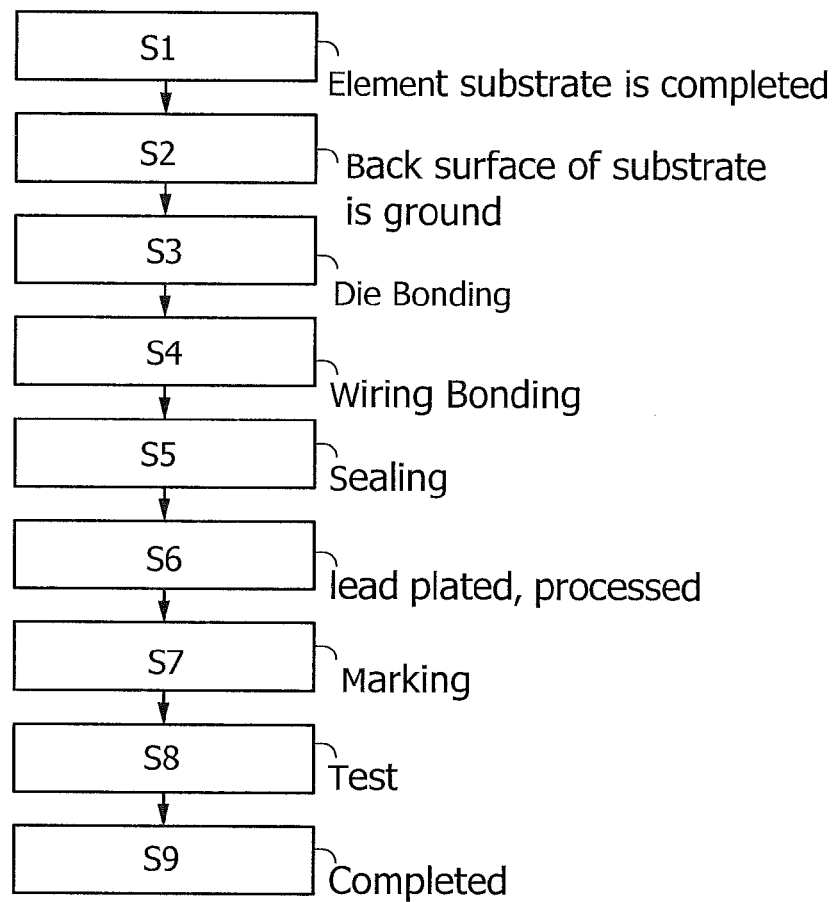
FIG. 15A is a flowchart showing a manufacturing process of an electronic component.

FIG. 15A shows an example where the semiconductor device described in the above embodiments is used to make an electronic component. Note that the electronic component is also referred to as semiconductor package or IC package. The electronic component has a plurality of standards and names depending on a terminal extraction direction and a terminal shape. Thus, examples of the electronic component will be described in this embodiment.

Figure 13B:
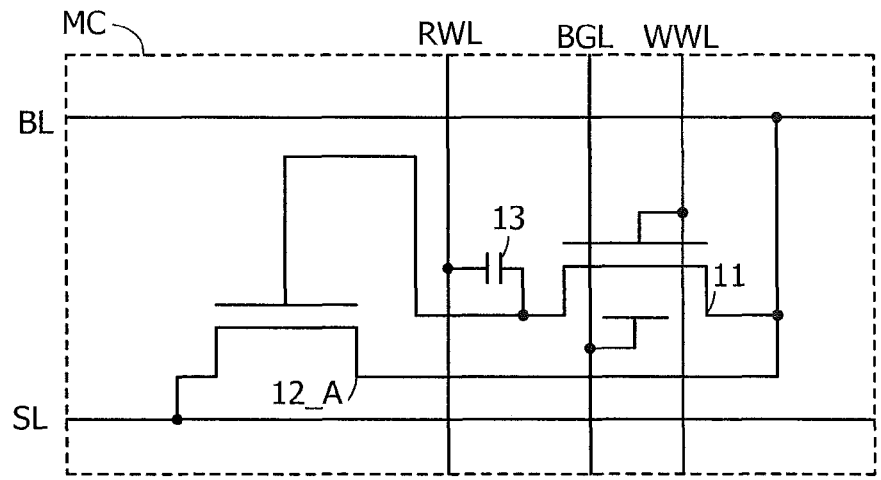

A memory device including the transistors illustrated in FIGS. 13A and 13B and FIG. 14 of Embodiment 4 is completed by integrating detachable components on a printed circuit board through the assembly process (post-process).

The post-process can be completed through steps shown in FIG. 15A. Specifically, after an element substrate obtained in the preceding process is completed (Step S1), a back surface of the substrate is ground (Step S2). The substrate is thinned in this step to reduce warpage or the like of the substrate in the preceding process and to reduce the size of the component itself.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, a method such as resin bonding or tape-automated bonding is selected as appropriate depending on products. Note that in the die bonding step, a chip may be mounted on an interposer to be bonded.

Next, wiring bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. Then, the lead is cut and processed into a predetermined shape (Step S6). Through the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

The aforementioned electronic component can include the semiconductor device described in the above embodiments. Thus, an electronic component that is high in data writing speed can be obtained.

Figure 15B:
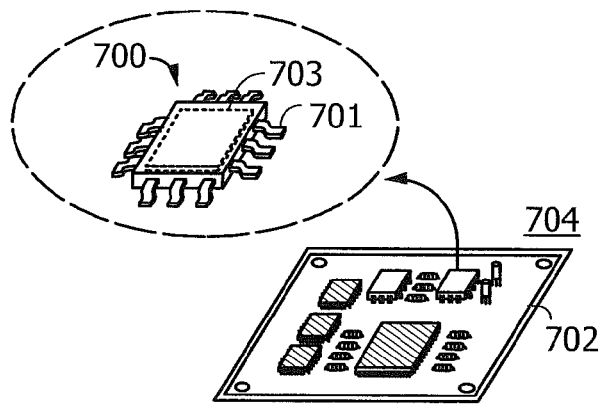
FIG. 15B is a schematic perspective view of the electronic component.

FIG. 15B is a schematic perspective view of the completed electronic component. FIG. 15B is a schematic perspective view illustrating a quad flat package (QFP) as an example of the electronic component. A lead 701 and a circuit portion 703 of an electronic component 700 are shown in FIG. 15B. The electronic component 700 in FIG. 15B is, for example, mounted on a printed circuit board 702. When a plurality of electronic components 700 are used in combination and electrically connected to each other over the printed wiring board 702, the electronic components 700 can be mounted on an electronic device. The completed circuit board 704 is provided in an electronic device or the like.

Next, the description will be made on applications of the above electronic component to electronic devices such as a computer, a portable information terminal (including a mobile phone, a portable game machine, an audio reproducing device, and the like), electronic paper, a television device (also referred to as television or television receiver), and a digital video camera.

Figure 16A:
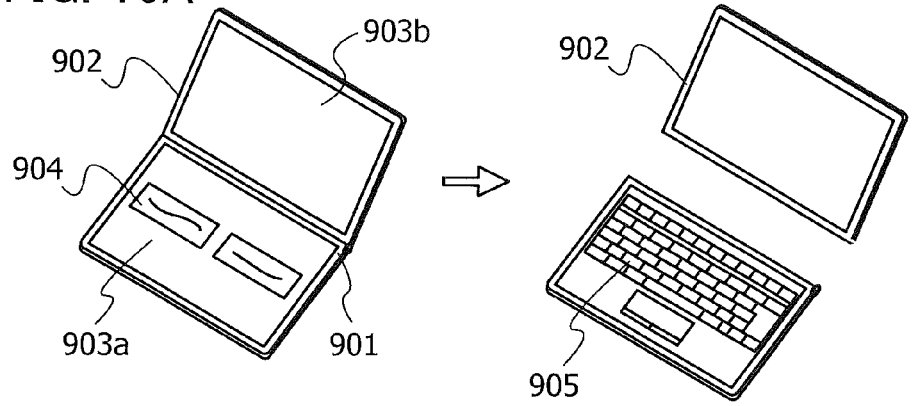
FIGS. 16A to 16E illustrate electronic devices including electronic components.

FIG. 16A illustrates a portable information terminal, which includes a housing 901, a housing 902, a first display portion 903a, a second display portion 903b, and the like. The semiconductor device described in the above embodiments is provided inside at least one of the housings 901 and 902. Thus, a portable information terminal that is high in data writing speed can be obtained.

Note that the first display portion 903a is a touch panel, and for example, as illustrated in the left of FIG. 16A, which of "touch input" and "keyboard input" is performed can be selected by a selection button 904 displayed on the first display portion 903a. Since the selection buttons with a variety of sizes can be displayed, the portable information terminal can be easily used by people of any generation. In the case where "keyboard input" is selected, for example, a keyboard 905 is displayed on the first display portion 903a as illustrated in the right of FIG. 16A. With such a structure, letters can be input quickly by keyboard input as in the case of using a conventional information terminal, for example.

Furthermore, one of the first display portion 903a and the second display portion 903b can be detached from the portable information terminal as illustrated in the right in FIG. 16A. Providing the second display portion 903b with a touch input function makes the information appliance convenient to carry because the weight can be further reduced and the information terminal can operate with one hand while the other hand supports the housing 902.

The portable information terminal illustrated in FIG. 16A can have a function of displaying a variety of kinds of data (e.g., a still image, a moving image, and a text image), a function of displaying a calendar, a date, the time, or the like on the display portion, a function of operating or editing data displayed on the display portion, a function of controlling processing by a variety of kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 16A may transmit and receive data wirelessly. Through wireless communication, desired book data or the like can be purchased and downloaded from an e-book server.

Furthermore, the housing 902 in FIG. 16A may have an antenna, a microphone function, or a wireless communication function to be used as a mobile phone.

Figure 16B:
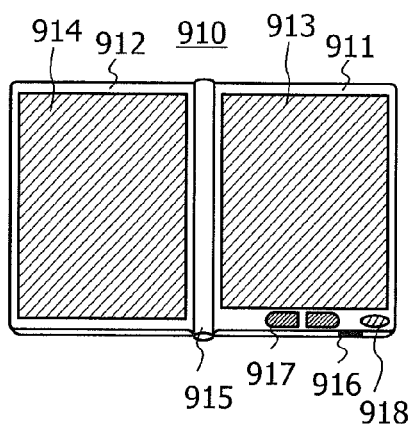

FIG. 16B shows an e-book reader 910 including electronic paper. The e-book reader 910 includes two housings 911 and 912. The housing 911 and the housing 912 are provided with a display portion 913 and a display portion 914, respectively. The housings 911 and 912 are connected by a hinge portion 915 and can be opened or closed with the hinge portion 915 as an axis. The housing 911 is provided with a power switch 916, an operation key 917, a speaker 918, and the like. The semiconductor device described in the above embodiments is provided in at least one of the housings 911 and 912. Thus, an e-book reader that is high in data writing speed can be obtained.

Figure 16C:
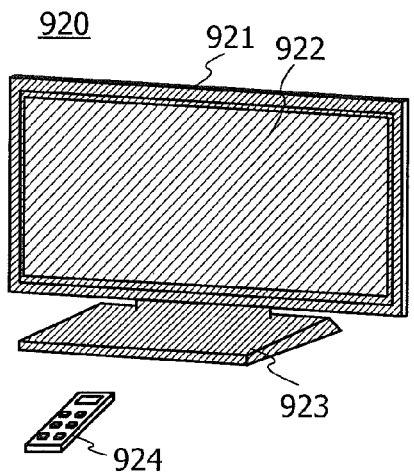

FIG. 16C is a television device, which includes a housing 921, a display portion 922, a stand 923, and the like. The television device 920 can operate with a switch on the housing 921 and a separate remote controller 924. The semiconductor device described in the above embodiments is provided in the housing 921 and the remote controller 924. Thus, a television device that is high in data writing speed can be obtained.

Figure 16D:
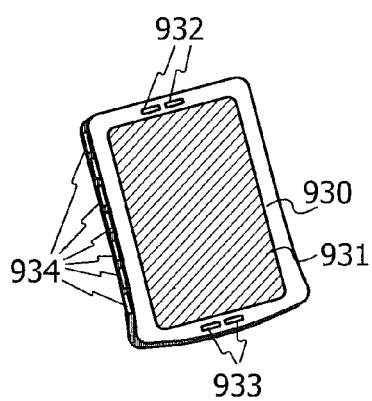

FIG. 16D shows a smartphone in which a main body 930 includes a display portion 931, a speaker 932, a microphone 933, operation buttons 934, and the like. The semiconductor device described in the above embodiments is provided in the main body 930. Thus, a smartphone that is high in data writing speed can be obtained.

Figure 16E:
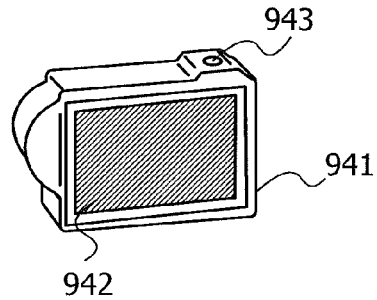

FIG. 16E shows a digital camera, which includes a main body 941, a display portion 942, an operation switch 943, and the like. The semiconductor device described in the above embodiments is provided in the main body 941. Thus, a digital camera that is high in data writing speed can be obtained.

As described above, the electronic devices described in this embodiment each include the semiconductor device according to any of the above embodiments. Thus, electronic devices that are high in data writing speed can be obtained.

This application is based on Japanese Patent Application serial no. 2014-072058 filed with Japan Patent Office on Mar. 31, 2014, the entire contents of which are hereby incorporated by reference.

What is claimed is:

1. A semiconductor device comprising:
a first memory cell comprising a first transistor, a second transistor, and a capacitor;
a second memory cell comprising a third transistor;
a first wiring configured to be supplied with a data voltage;
a second wiring; and
a first switch,
wherein the first wiring is electrically connected to one of a source and a drain of the first transistor,
wherein the second wiring is electrically connected to the other of the source and the drain of the first transistor, one of a source and a drain of the second transistor, and one of a source and a drain of the third transistor,
wherein the other of the source and the drain of the second transistor is electrically connected to a gate of the first transistor and one electrode of the capacitor, and
wherein the first switch is provided between the other of the source and the drain of the first transistor and the one of the source and the drain of the third transistor.

2. The semiconductor device according to claim 1, wherein a channel formation region of the first transistor comprises silicon.

3. The semiconductor device according to claim 1, wherein a channel formation region of the second transistor comprises an oxide semiconductor.

4. The semiconductor device according to claim 1, wherein the first memory cell is adjacent to the second memory cell in a column direction.

5. The semiconductor device according to claim 1,
wherein the first switch comprises a fourth transistor,
wherein one of a source and a drain of the fourth transistor is electrically connected to the other of the source and the drain of the first transistor, and
wherein the other of the source and the drain of the fourth transistor is electrically connected to the one of the source and the drain of the third transistor.

6. The semiconductor device according to claim 1,
wherein the first switch comprises a fourth transistor, and
wherein a channel formation region of the fourth transistor comprises an oxide semiconductor.

7. The semiconductor device according to claim 1, wherein a gate of the second transistor is electrically connected to a third wiring.

8. The semiconductor device according to claim 1, wherein the other electrode of the capacitor is electrically connected to a fourth wiring.

9. The semiconductor device according to claim 1, further comprising a second switch,
wherein the data voltage is supplied to the first wiring by the second switch.

10. The semiconductor device according to claim 1, further comprising a third switch and a fourth switch,
wherein a potential of the first wiring is output as an output data by the third switch, and
wherein a precharge voltage is supplied to the first wiring by the third switch and the fourth switch.

11. The semiconductor device according to claim 1, further comprising a fifth switch,
wherein a ground potential is supplied to the second wiring by the fifth switch.

12. An electronic component comprising:
the semiconductor device according to claim 1; and
a lead electrically connected to the semiconductor device.

13. An electronic device comprising:
the electronic component according to claim 12; and
a display device.

* * * * *